US011648886B2

(12) United States Patent
Oros Cisneros et al.

(10) Patent No.: US 11,648,886 B2
(45) Date of Patent: May 16, 2023

(54) RAIL MOUNTED ACCESSORY CLAMPING AND LOCKING SYSTEM WITH POWER TRANSMISSION AND ON/OFF COMMAND

(71) Applicant: Ford Global Technologies, LLC, Dearborn, MI (US)

(72) Inventors: Fernando Alfonso Oros Cisneros, Atizapán de Zaragoza (MX); Antonio Espíritu Santo, Atizapán de Zaragoza (MX); Jacobo Alejandro Vera Gómez, Cuautitlán Izcalli (MX)

(73) Assignee: Ford Global Technologies, LLC, Dearborn, MI (US)

( * ) Notice: Subject to any disclaimer, the term of this patent is extended or adjusted under 35 U.S.C. 154(b) by 111 days.

(21) Appl. No.: 17/465,380

(22) Filed: Sep. 2, 2021

(65) Prior Publication Data

US 2023/0069379 A1    Mar. 2, 2023

(51) Int. Cl.
*B60R 11/00* (2006.01)
*B60R 9/045* (2006.01)
*B60R 16/03* (2006.01)
*E05B 77/00* (2014.01)
*H05K 7/14* (2006.01)
*E05B 83/00* (2014.01)
*B60Q 1/26* (2006.01)

(52) U.S. Cl.
CPC .............. *B60R 11/00* (2013.01); *B60R 9/045* (2013.01); *B60R 16/03* (2013.01); *E05B 77/00* (2013.01); *E05B 83/00* (2013.01); *H05K 7/14* (2013.01); *B60Q 1/2661* (2013.01); *B60R 2011/004* (2013.01); *B60R 2011/005* (2013.01)

(58) Field of Classification Search
CPC ........... B60R 16/03; B60R 9/04; B60R 9/045; B60R 9/048; B60R 9/05; B60R 9/052; E05B 81/54
USPC .................................................... 439/34, 314
See application file for complete search history.

(56) References Cited

U.S. PATENT DOCUMENTS

| | | | |
|---|---|---|---|
| 2,825,799 A * | 3/1958 | Julien ...................... | B60Q 7/00 439/297 |
| 3,455,580 A | 7/1969 | Howard | |
| 3,544,140 A | 12/1970 | Langheck | |

(Continued)

FOREIGN PATENT DOCUMENTS

| | | | | |
|---|---|---|---|---|
| DE | 202022102417 U1 * | 9/2022 | | |
| EP | 1442940 A1 * | 8/2004 | ............. | B60R 9/045 |

(Continued)

*Primary Examiner* — Justin M Larson
(74) *Attorney, Agent, or Firm* — Frank Lollo; Price Heneveld LLP

(57) ABSTRACT

An electrically-powered accessory for vehicles includes a vehicle structure. A connector mechanically connects an electrically-powered accessory to vehicle structure. The connector includes a movable lock member that mechanically locks the electrically-powered accessory to the vehicle structure when the movable lock member is in a locked position. The movable lock member causes the electrically-powered accessory to be electrically connected to an electrical power supply of the vehicle when the movable lock member is in the locked position, and electrically disconnects the electrically-powered accessory from the vehicle power supply when the movable lock member is in the unlocked position.

19 Claims, 13 Drawing Sheets

(56) References Cited

U.S. PATENT DOCUMENTS

| | | | | |
|---|---|---|---|---|
| 5,306,156 | A * | 4/1994 | Gibbs | H01R 13/639 |
| | | | | 224/315 |
| 5,624,266 | A * | 4/1997 | Gibbs | H01R 13/629 |
| | | | | 224/315 |
| 5,685,730 | A | 11/1997 | Cameron et al. | |
| 6,114,954 | A * | 9/2000 | Palett | B60Q 1/381 |
| | | | | 340/478 |
| 8,770,453 | B2 | 7/2014 | Lang | |
| 9,290,123 | B2 * | 3/2016 | Salter | F21S 41/16 |
| 9,718,410 | B2 | 8/2017 | Cropley et al. | |
| 9,950,675 | B2 | 4/2018 | Schactman et al. | |
| 10,464,497 | B2 * | 11/2019 | Kondo | E05F 15/611 |
| 10,479,427 | B2 * | 11/2019 | Scaringe | B60K 1/04 |
| 10,857,863 | B2 * | 12/2020 | Dellock | B60R 9/042 |
| 10,870,453 | B2 * | 12/2020 | Elder | B60R 9/052 |
| 10,994,662 | B2 * | 5/2021 | Salter | B60Q 1/0023 |
| 11,230,326 | B2 * | 1/2022 | Elder | B60Q 1/0035 |
| 11,390,210 | B2 * | 7/2022 | Chen | B60Q 1/2661 |
| 2004/0118889 | A1 * | 6/2004 | Hamilton | B62J 9/30 |
| | | | | 224/413 |
| 2006/0261109 | A1 * | 11/2006 | Browne | B60R 9/04 |
| | | | | 224/328 |
| 2020/0149316 | A1 * | 5/2020 | Parker | E05B 73/0005 |
| 2021/0061181 | A1 * | 3/2021 | Bica | B60R 9/055 |
| 2022/0212627 | A1 * | 7/2022 | Nilsson | B60R 25/24 |

FOREIGN PATENT DOCUMENTS

| | | | | |
|---|---|---|---|---|
| WO | WO-2005037606 A1 * | 4/2005 | | B60R 9/058 |
| WO | WO-2006122350 A1 * | 11/2006 | | B60R 9/058 |

* cited by examiner

RAIL MOUNTED ACCESSORY CLAMPING AND LOCKING SYSTEM WITH POWER TRANSMISSION AND ON/OFF COMMAND

FIELD OF THE DISCLOSURE

The present disclosure generally relates to a rack for a vehicle that may be configured to provide electrical power to an accessory associated with the rack.

BACKGROUND OF THE DISCLOSURE

Various types of racks have been developed for motor vehicles. Known racks may be utilized to secure items to an exterior of a vehicle. The existing racks may be positioned on an upper portion of a vehicle (e.g., above a passenger compartment of a vehicle), trunk, or attached to a tow hitch/receiver. Tow hitch racks may be referred to as cargo carriers. Yet another type of rack is configured to mount to a pickup truck to support various items above the bed of the truck. These types of racks may attach to the body of the truck adjacent the bed and/or to a pickup truck cab. Racks have also been developed to support objects on a cap that covers the bed of a pickup truck.

Known racks may be configured to support a wide variety of items such as ladders, tools, pipes, boards, sporting goods such as kayaks, bicycles, skis, snowboards, fishing rods, surfboards, snow skis, water skis, etc. Furthermore, various powered accessories such as Light Emitting Diode (LED) light bars, etc., may also be mounted to racks, including racks configured to be mounted to a vehicle structure above a passenger space or other types of vehicle racks. LED lights, or the like, may comprise a separate light bar, or may comprise a part of a storage rack or the like.

SUMMARY OF THE DISCLOSURE

An aspect of the present disclosure is a combination electrically-powered rack accessory and rack for motor vehicles, including a first rail and a second rail spaced from the first rail. A vehicle electrical conductor is adapted to be operably connected to an electrical power supply of a vehicle. An electrically-powered rack accessory includes an electrical conductor. A first connector mechanically connects the electrically-powered rack accessory to the first rail, and a second connector mechanically connects the electrically-powered rack accessory to the second rail. The first connector includes a movable lock member that is movable between a locked position and an unlocked position. The movable lock member mechanically locks the electrically-powered rack accessory to the first rail when the movable lock member is in the locked position to prevent detachment of the electrically-powered rack accessory from the first rail when the movable lock member is in the locked position. The movable lock member causes the electrical conductor of the electrically-powered rack accessory to be electrically connected to the vehicle electrical conductor when the movable lock member is in the locked position, and causes the electrical conductor of the electrically-powered rack accessory to be electrically disconnected from the vehicle electrical conductor when the movable lock member is in the unlocked position.

Embodiments of the first aspect of the present disclosure can include any one or a combination of the following features:

- at least one of the first rail and the second rail may extend in a fore-and-aft direction;
- the first rail may be substantially parallel to the second rail;
- the movable lock member may include an electrically conductive vehicle contact and an electrically conductive accessory contact, wherein the electrically conductive vehicle contact is electrically connected to the electrically conductive accessory contact;
- when the movable lock member is in the locked position, the electrically conductive vehicle contact may be electrically connected to the vehicle electrical conductor, and the electrically conductive accessory contact may be electrically connected to the electrical conductor of the electrically-powered rack accessory;
- the first connector may include a body, and the movable lock member may be pivotably interconnected with the body and pivot between the locked position and the unlocked position;
- the movable lock member may include a central portion and a first projection extending outwardly from the central portion;
- the movable lock member may further include a second projection extending outwardly from the central portion;
- the electrically conductive vehicle contact may be located on the first projection, and the electrically conductive accessory contact may be located on the second projection;
- the electrically conductive vehicle contact may comprise a pin disposed on the first projection, and the vehicle electrical conductor may comprise a resilient conductor mounted to the first rail;
- the central portion of the movable lock member may define a pivot axis about which the movable lock member pivots; the first projection may include a radial first portion that extends radially outward away from the pivot axis, and a transverse end portion that is transverse to the radial first portion; the pin may be disposed on the transverse end portion of the first projection;
- the first rail may include a connector opening, and the body of the first connector may be at least partially disposed in the connector opening;
- the first rail may include an inner side and an outer side, and the connector opening may extend between the inner side and the outer side; the first rail may further include a lock surface disposed between the inner and outer sides of the first rail; the first projection may engage the lock surface when the movable lock member is in the locked position to prevent removal of the body of the first connector from the connector opening of the first rail;
- the electrically-powered rack accessory may include a cavity, and the electrically conductive accessory contact may be disposed in the cavity; the second projection may be received in the cavity of the electrically conductive accessory and the electrically conductive accessory contact on the second projection may engage the electrical conductor of the electrically-powered rack accessory when the movable lock member is in the locked position;
- the movable member may have an inner end and outer end, and the first projection may be located adjacent the outer end, and the second projection may be located adjacent the inner end; the cavity of the electrically-powered rack accessory may include a first portion that is configured to receive the inner end of the movable lock member, and an accessory lock surface extending transverse relative to the first portion; the second projection may engage the accessory lock surface when the movable lock member is in the locked position to thereby prevent removal of the movable lock member from the cavity of the electrically-powered rack accessory; and the vehicle may include a user interface that is operably connected to the vehicle electrical conductor; the user interface may be configured to permit a user to control the electrically-powered rack accessory from a passenger space of a motor vehicle.

Another aspect of the present disclosure is an electrically-powered exterior accessory for motor vehicles including a support structure that is configured to be removably mounted to a vehicle exterior structure. A lock mechanism includes a movable lock member that is movable from the locked position to an unlocked position. The movable lock member is configured to engage the support structure and the vehicle exterior structure when the movable lock member is in a locked position to thereby prevent removal of the structure from the vehicle exterior structure when the movable lock member is in the locked position. The support structure can be removed from the vehicle exterior structure when the movable lock member is in the unlocked position. The movable lock member further includes vehicle contacts that are electrically connected to accessory contacts whereby, when the movable lock member is in the locked position, the vehicle contacts are configured to engage conductors of a vehicle electrical system, and the accessory contacts simultaneously engage conductors of the electrically-powered exterior accessory. When the movable lock member is in the unlocked position, the accessory contacts are disengaged from the conductors of the electrically-powered exterior accessory and/or the vehicle contacts are configured to be disengaged from the conductors of a vehicle electrical system.

Embodiments of the second aspect of the present disclosure can include any one or a combination of the following features:

the lock mechanism may include a body, and the movable lock member may be rotatably mounted to the body; the movable lock member may include a central portion about which the movable lock member rotates, and first and second projections extending outwardly away from the central portion; the vehicle contacts may be disposed on the first projection, and the accessory contacts may be disposed on the second projection;

the support structure may include a lock surface, and the second projection may engage the lock surface when the movable lock member is in the locked position; and the body of the lock member may comprise a first bearing surface, and the central portion of the movable lock member may include a second bearing surface; the first bearing surface may engage the second bearing surface whereby the movable lock member is rotatably supported by the body.

Another aspect of the present disclosure is a method of mechanically and electrically connecting an electrically-powered accessory to a motor vehicle. The method includes moving a lock member from a disengaged position to an engaged position. Moving the lock member from the disengaged position to an engaged position causes the electrically-powered accessory to be mechanically secured to the motor vehicle and also causes the electrically-powered accessory to be electrically connected to an electrical power system of the motor vehicle.

Embodiments of a third aspect of the present disclosure can include any one or a combination of the following features:

the lock member may be rotatably interconnected to a body, and moving the lock member from a disengaged position to an engaged position includes rotating the lock member relative to the body;

the method may include utilizing a support structure of the electrically-powered accessory to engage a vehicle exterior structure prior to moving the lock member from the disengaged position to the engaged position; the lock member may include accessory contacts that are electrically connected to vehicle contacts; and moving the lock member from the disengaged position to the engaged position may include: 1) bringing the accessory contacts into contact with electrical conductors of the electrically-powered accessory; and 2) bringing the vehicle contacts into contact with the electrical conductors of the electrically-powered accessory such that the electrically-powered accessory is powered by the vehicle electrical power system when the lock member is in the engaged position; and the vehicle contacts may be disposed on a first projection of the lock member, and the accessory contacts may be disposed on the second projection of the lock member; moving the lock member from the disengaged position to the engaged position may include rotating the lock member to cause the first projection to engage a lock surface of the vehicle exterior structure and cause the second projection to engage a lock surface of the electrically-powered accessory.

These and other aspects, objects, and features of the present disclosure will be understood and appreciated by those skilled in the art upon studying the following specification, claims, and appended drawings.

DETAILED DESCRIPTION OF THE PREFERRED EMBODIMENTS

As required, detailed embodiments of the present disclosure are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
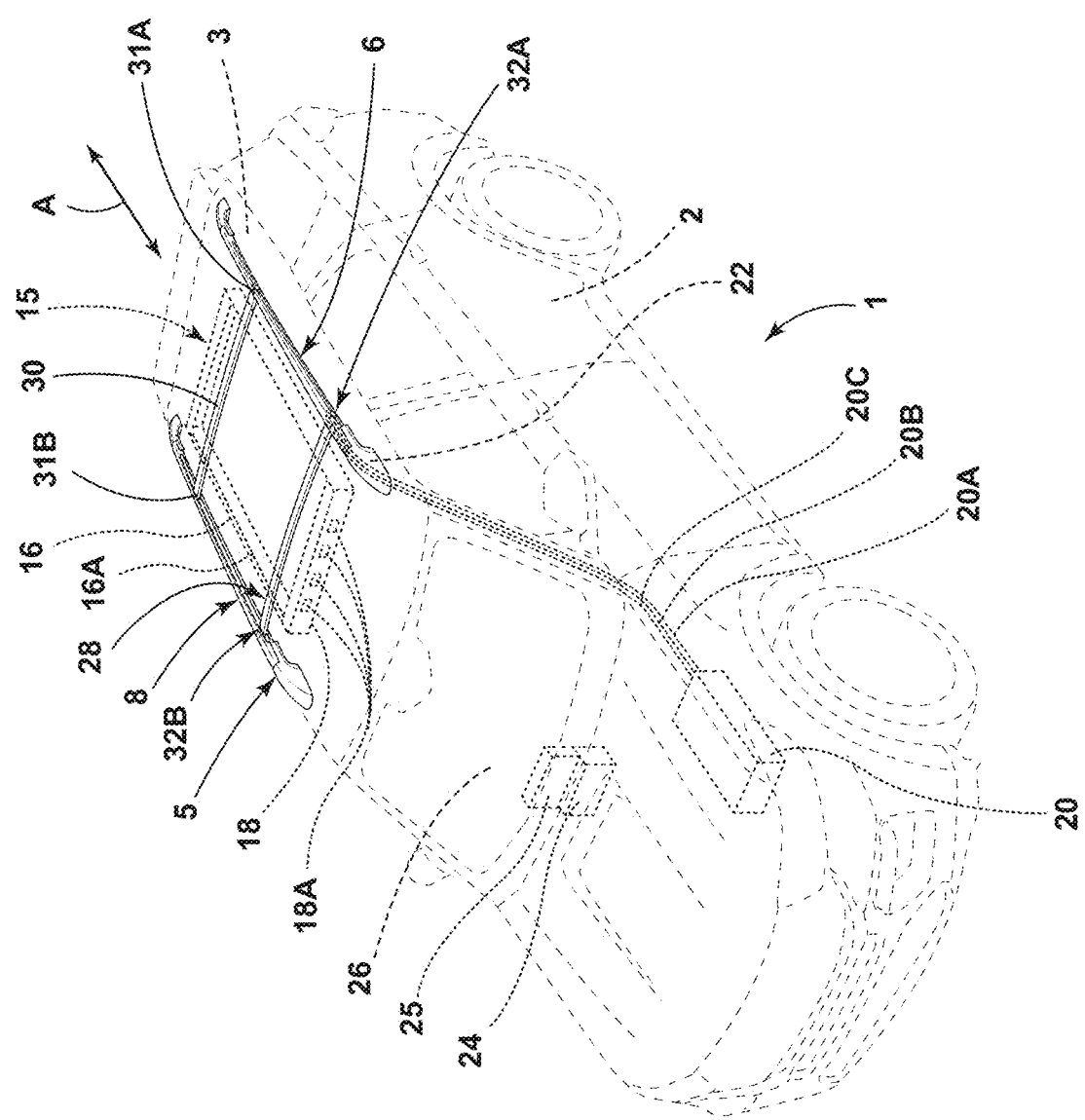
FIG. 1 is a partially schematic isometric view of a motor vehicle including an electrically-powered accessory according to an aspect of the present disclosure.

For purposes of description herein, the terms "upper," "lower," "right," "left," "rear," "front," "vertical," "horizontal," and derivatives thereof shall relate to the concepts as oriented in FIG. 1. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements is not limited to only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

Figure 2:
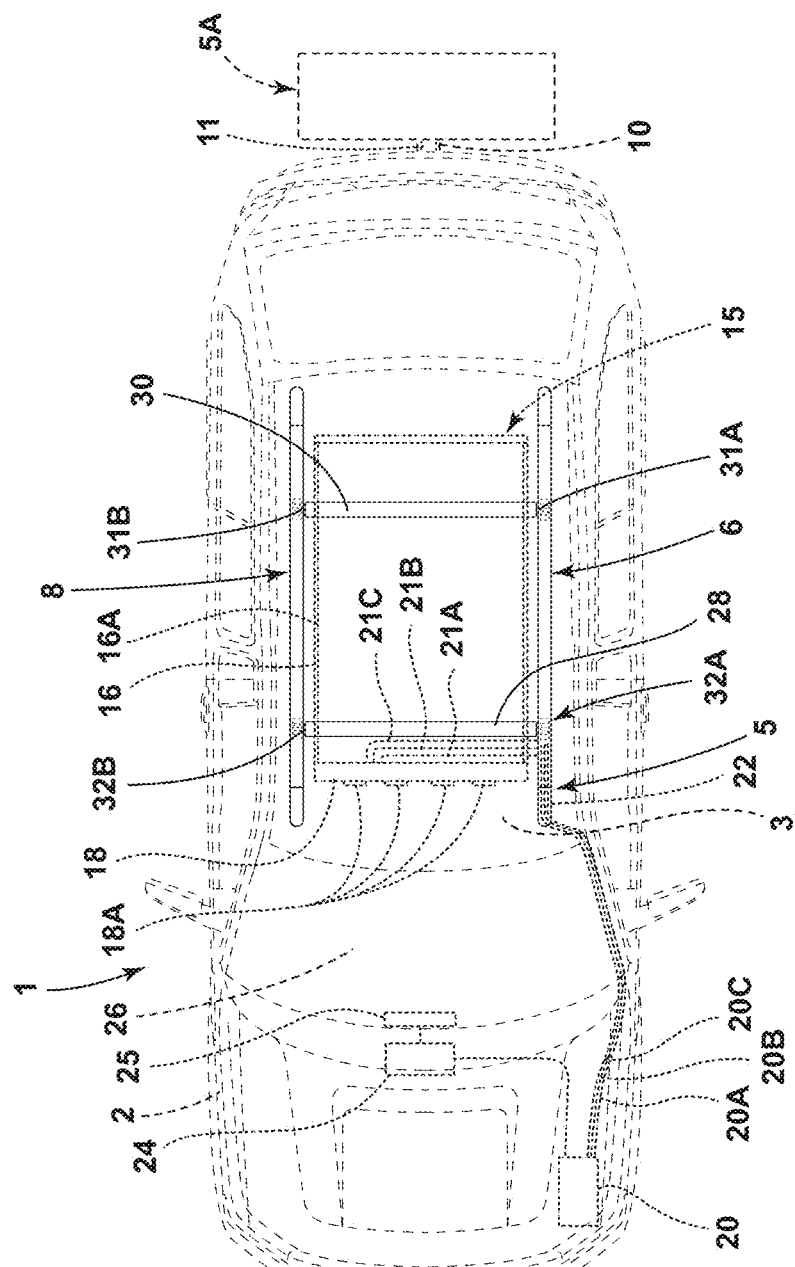
FIG. 2 is a partially schematic top plan view of the vehicle of FIG. 1.

With reference to FIGS. 1 and 2, a motor vehicle 1 may include a body 2 having a vehicle structure 3 that may be at least partially disposed above an interior space 26 of a motor vehicle 1. A rack assembly 5 may be disposed on vehicle structure 3. Alternatively, a rack assembly 5A (FIG. 2) may include a connector 10 that is connected to a receiver 11. The connector 10 may include a known trailer hitch connector, and receiver 11 may comprise a conventional trailer hitch receiver of a type that is known in the art. It will be understood that various types of connectors and trailer hitch receivers for mounting cargo racks are generally known, and the present disclosure is not limited to any specific type of rack, hitch, or receiver. Connector 10 may optionally include a locking mechanism that mechanically and electrically interconnects rack assembly 5A to receiver 11 in a manner that is substantially similar to that of lock mechanism 38 described in more detail below and receiver 11 may include electrical conductors and corresponding features.

Referring again to FIG. 1, rack assembly 5 may include an exterior vehicle structure which may include a first rail 6 and/or a second rail 8. In the example of FIG. 1, the first and second rails 6 and 8 are substantially parallel to one another and extend in a fore-and-aft vehicle direction "A." However, the first and second rails 6 and 8 do not necessarily need to be parallel, and the first and second rails 6 and 8 also do not necessarily need to extend in a fore-and-aft direction. Still further, the first and second rails 6 and 8 do not necessarily need to be positioned on a structure of a vehicle above a passenger compartment. For example, the rails 6 and 8 could be positioned along the edges of a bed of a pickup truck, or the rails could extend transverse to the vehicle fore-and-aft direction "A" (e.g., transversely over a bed of a pickup truck). It will be understood that virtually any exterior vehicle structure may be utilized according to the present disclosure, and rails 6 and 8 are merely examples of a suitable structure.

An electrically-powered accessory 15 may be mechanically and electrically connected to the first and second rails 6 and 8, respectively. In the illustrated example, electrically-powered accessory 15 comprises a cargo carrier 16 and/or an LED light bar 18 having one or more LEDs 18A. It will be understood that electrically-powered accessory 15 may comprise virtually any type of accessory unit that is configured to draw electrical power from a vehicle power supply 20 via wires/conductive lines/electrical conductors 20A-20C of vehicle 1. The vehicle power supply 20 may comprise a battery and/or other components of a type that are generally known in the art. Conductors 20A-20C may comprise an electrical harness having electrical lines (e.g., wires) that extend from the electrical power supply 20 to at least one of the first and second rails 6 and 8, either directly or indirectly. In the illustrated example, first exterior structure or rail 6 is tubular, having an interior space 22, and the conductors 20A-20C extend inside the interior space 22 of first exterior structure or rail 6. Vehicle 1 may include a controller 24 and user interface 25 disposed in interior space 26 of vehicle 1. In general, controller 24 may comprise one or more individual controllers or modules that may be operably interconnected via data networks (not specifically shown) and other components. The vehicle 1 may also include a user interface 25 that is operably connected to the controller 24. The user interface 25 may comprise virtually any suitable arrangement or device. For example, user interface 25 may comprise a touch screen display disposed in interior space 26 to allow a user to provide inputs. The user interface 25 may be operably connected to the controller 24 and/or the electrically-powered accessory 15 to permit a user to control the electrically-powered accessory 15 from the interior space 26 of vehicle 1. It will be understood that the user interface 25 may comprise virtually any suitable device such as switches, buttons, audio control inputs (e.g., one or more microphones), and a wired or wireless interface with a smartphone, tablet, or other such device.

Referring again to FIGS. 1 and 2, the electrically-powered accessory 15 includes a support structure which may optionally include various suitable structures such as first and second structures 28 and 30. Structures 28 and 30 may be connected to an exterior vehicle structure (e.g., first and second rails 6 and 8). It will be understood that structures 28 and 30 of electrically-powered accessory 15 may comprise portions of a single structure. Thus, the electrically-powered accessory 15 of the present disclosure is not limited to any specific structural configuration. For example, electrically-powered accessory 15 may comprise a light bar 18 that is not part of a cargo carrier 16, and the light bar 18 may be mounted to a single structure 28. Also, cargo carrier 16 may comprise a rigid perimeter frame 16A or other suitable support structure that does not include separate first and second structures 28 and 30. If the electrically-powered accessory 15 includes a second structure 30, the second structure 30 may be releasably connected to rails 6 and 8 by connectors 31A and 31B. The connectors 31A and 31B may comprise mechanical connectors of a known type, or they may be substantially similar to lock assembly 28, which is described in more detail below. Connectors 31A and/or 31B may optionally include electrical connectors that may be similar to those of lock assembly 38, but may, alternatively, have solely mechanical connecting features. It will be understood that numerous types of mechanical connectors are known, and the mechanical connectors 31A and 31B may be substantially similar to known connectors.

The electrically-powered accessory 15 may be secured to an exterior vehicle structure (e.g., rail 6 and/or rail 8) by first and second connectors 32A and 32B, respectively. The first connector 32A may interconnect the electrically-powered accessory 15 to first exterior structure or rail 6, both mechanically and electrically, and second connector 32B may connect electrically-powered accessory 15 to second exterior structure or rail 8, both mechanically and electrically. Alternatively, only one of the connectors 32A and 32B (e.g., first connector 32A) may be configured to provide an electrical connection.

Figure 3:
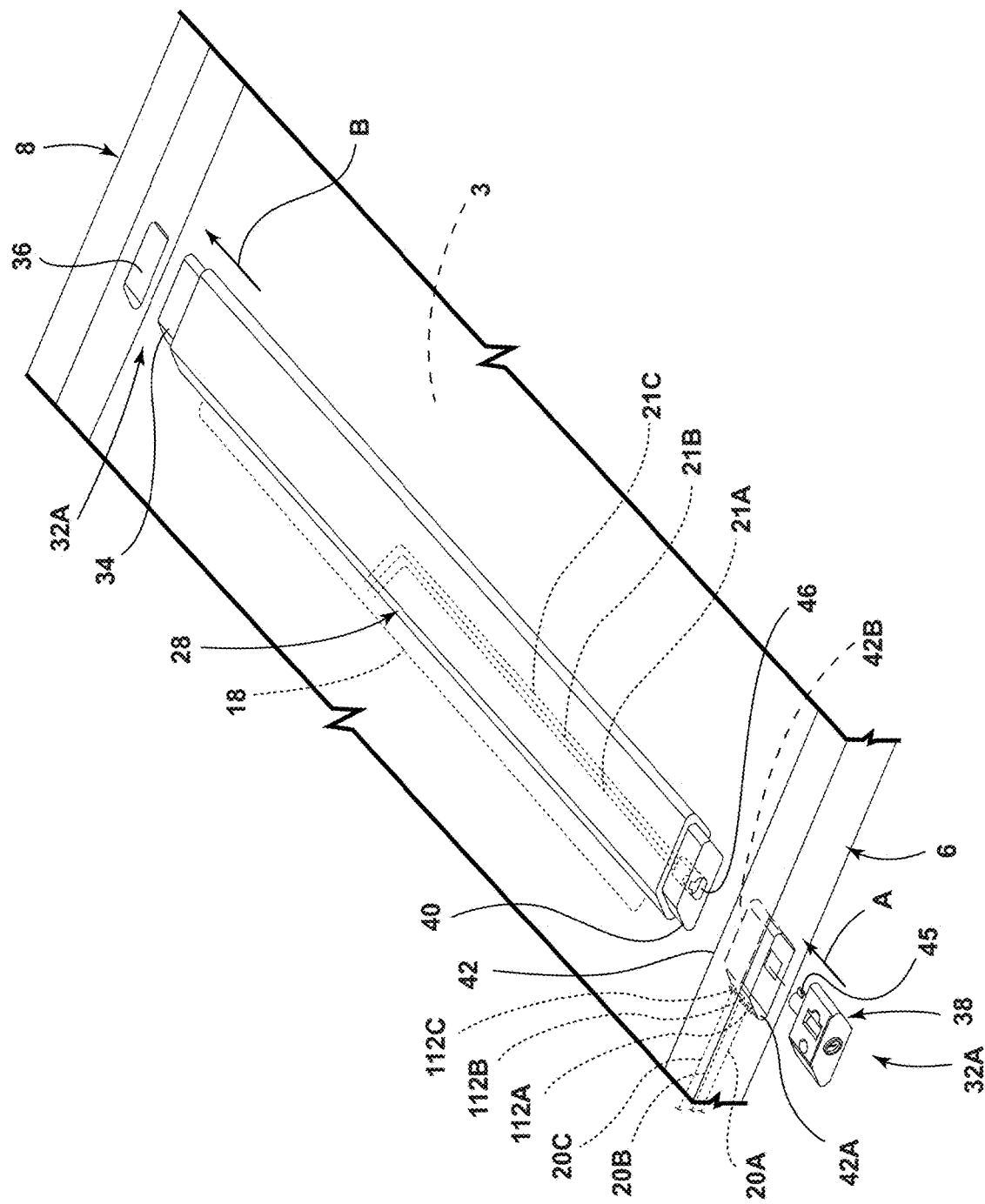
FIG. 3 is a partially schematic exploded isometric view showing a portion of the vehicle of FIG. 1.

With reference to FIG. 3, connector 32B may optionally comprise an end 34 of cross member 28 that is received in an opening 36 of vehicle structure/rail 8. To install electrically-powered accessory 15, structure 28 may be shifted in the direction of the arrow "B" to thereby insert end 34 of structure 28 into opening 36 of exterior structure or rail 8. End 34 may be configured to be closely received in opening 36 to thereby substantially prevent movement of electrically-powered accessory 15 relative to exterior structure or rail 8 except in the direction of arrow "B" during insertion, and opposite arrow "B" to disengage electrically-powered accessory 15 from exterior structure or rail 8.

The vehicle structure (e.g., rail 6) may optionally have an opening 42 therethrough having an outer side 42A and an inner side 42B. During installation of electrically-powered accessory 15, structure 28 may be shifted in a direction opposite the arrow "B" after end 34 is received in opening 36 of exterior structure or rail 8 to thereby position end 40 of structure 28 in opening 42 of exterior structure or rail 6. Alternatively, end 40 may be configured such that it is not received in opening 42, but rather abuts a surface of rail 6 adjacent opening 42. As discussed in more detail below, a lock assembly 38 may be inserted into outer side 42A of opening 42 in exterior structure or rail 6. The lock assembly 38 includes a rotating lock member 45 that engages a cavity 46 in end 40 of structure 28 to mechanically secure end 40 of structure 28 to exterior structure or rail 6, while also electrically interconnecting conductors 20A-20C of exterior structure or rail 6 to electrical conductors 21A-21C of electrically-powered accessory 15.

Figure 4:
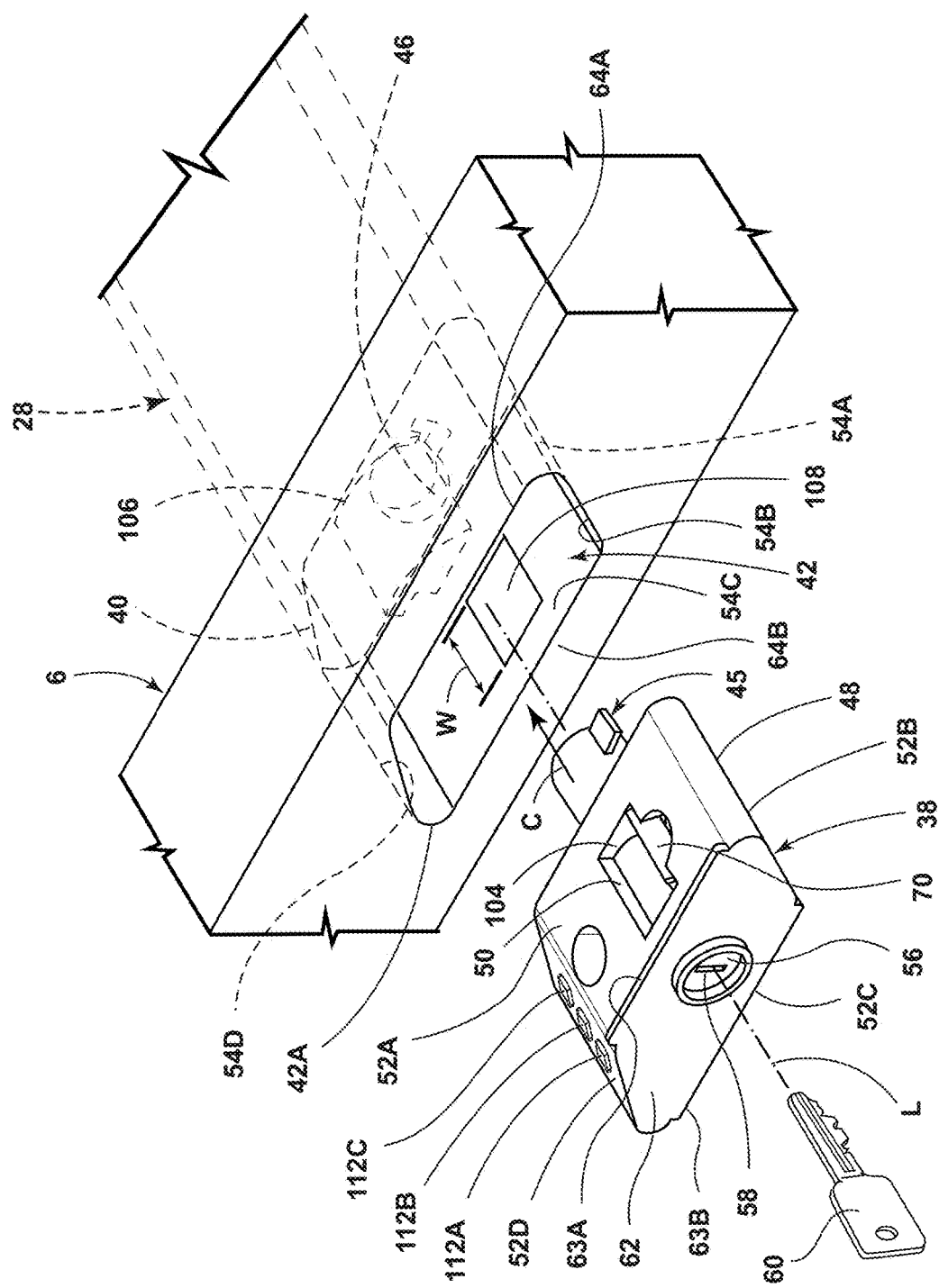
FIG. 4 is a partially schematic exploded isometric view showing a portion of the vehicle of FIG. 1.
Figure 5:
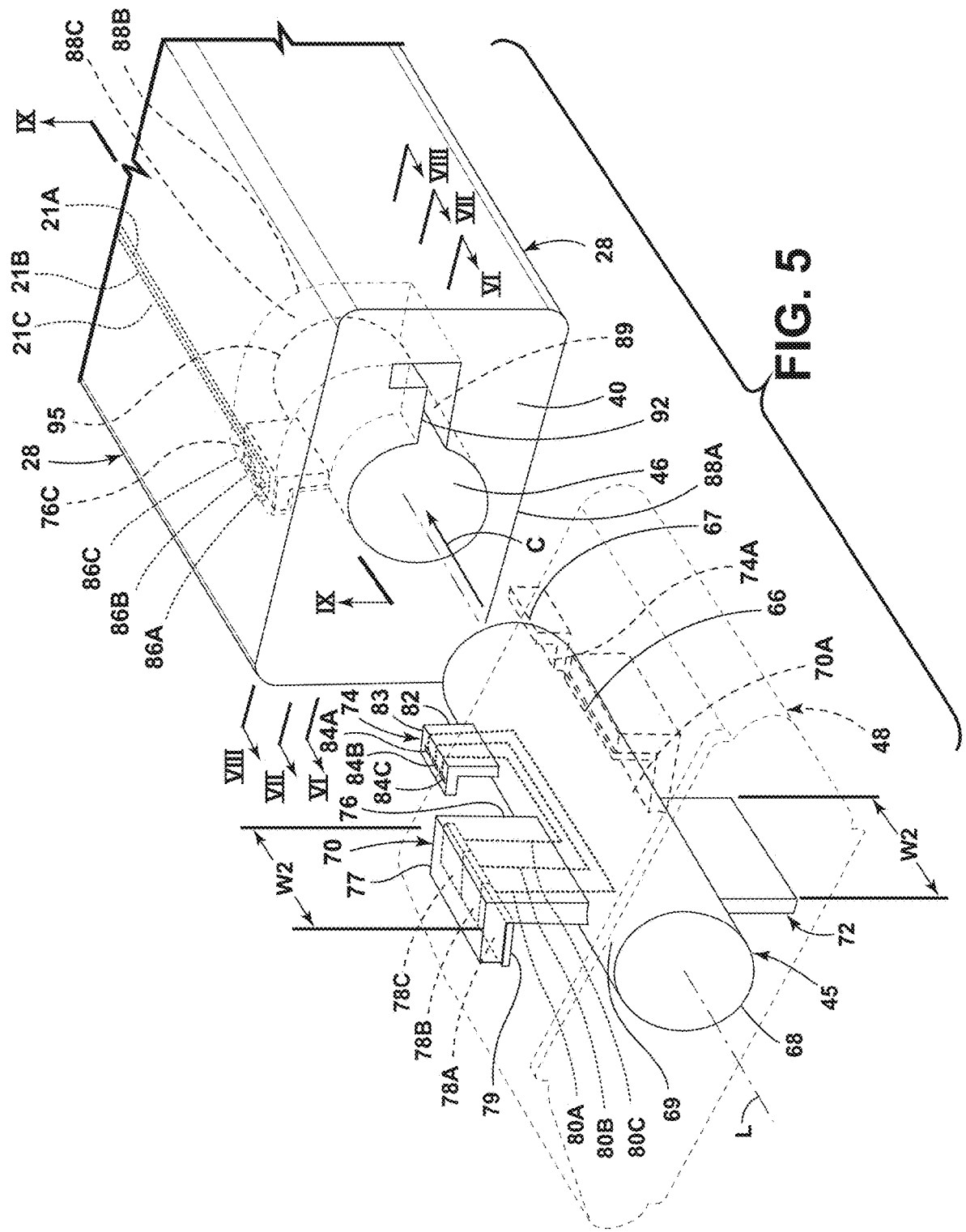
FIG. 5 is a partially schematic exploded isometric view showing a portion of the vehicle of FIG. 1.

With further reference to FIG. 4, lock assembly 38 includes a lock body 48 having outer surfaces 52A-52D that closely correspond in shape to inner surfaces 54A-54D, respectively, of opening 42 of exterior structure or rail 6. A portion of rotating lock member 45 may be at least partially disposed in a cavity 50 of lock body 48 of lock assembly 38. The rotating lock member 45 is rotatably about a lock axis "L" from an unlocked or disengaged position (FIG. 4) to a locked or engaged position (FIG. 5). The lock mechanism 38 may include a keyed lock mechanism 56 having a key opening 58 that receives a key to permit rotation of rotating lock member 45 between the unlocked position (FIG. 4) and the locked position (FIG. 5). For example, if the lock mechanism 38 is unlocked (FIG. 4), a key 60 can be inserted into key opening 58 when the lock body 48 of lock mechanism 38 is positioned in opening 42 of exterior structure or rail 6, and the key 60 can then be rotated to rotate the rotating lock member 45 to the locked position (FIG. 5). If the key is then removed, the lock mechanism 38 cannot be removed from the opening 42, and the key 60 must be inserted into key opening 58 to rotate the lock member 45 from the locked (engaged) position (FIG. 5) back to the unlocked (disengaged) position (FIG. 4) to thereby permit removal of lock mechanism 38 from opening 42 of exterior structure or rail 6. When the lock mechanism 38 is positioned in opening 42 of exterior structure or rail 6, and rotating lock member 45 is in the locked position, the lock mechanism 38 cannot be removed, and the lock mechanism 38 is therefore mechanically locked in position by the lock member 45. As discussed below, lock mechanism 38 also locks the electrically-powered accessory 15 to the exterior vehicle structure (e.g., rail 6) when rotating lock member 45 is in the locked position. It will be understood that numerous keyed lock mechanisms suitable for selectively locking lock member 45 in a fixed position relative to lock body 48 are known, and the present disclosure is not limited to a specific lock mechanism.

Lock mechanism 38 may include an end plate 62 having an upwardly-projecting tab 63A and a downwardly-projecting tab 63B. When the lock mechanism 38 is inserted into opening 42 of rail 6, tabs 63A and 63B engage outer surface portions 64A and 64B, respectively, of exterior structure or rail 6 adjacent outer side 42A of opening 42 to thereby limit inward travel of lock assembly 38 as the lock assembly 38 is inserted into opening 42 of exterior structure or rail 6.

With further reference to FIG. 5, rotating lock member 45 includes a central portion 66 that may be generally cylindrical, an inner end 67, and an outer end 68. The rotating lock member 45 further includes a first projection 70, a second projection 74, and a third projection 72. First projection 70 includes a first portion 76 that extends radially outwardly from cylindrical surface 69 of central portion 66. The first projection 70 further includes a transverse second or end portion 77. Electrically conductive pins 78A-78C are positioned on a lower side 79 of end portion 77 of first projection 70. The electrically conductive pins 78A-78C are electrically connected to wires/conductive lines/electrical conductors 80A-80C, respectively. Conductors 80A-80C may comprise wires or other suitable conductive material.

Third projection 72 includes a first portion 82 and a second transverse end portion 83. Conductive pins 84A-84C are disposed on transverse end portion 83. The conductive pins 84A-84C are electrically connected to the wires/conductive lines/electrical conductors 80A-80C, respectively, thereby electrically interconnecting pins 84A-84C to pins 78A-78C.

FIG. 5 is a partially schematic exploded view showing the rotating lock member 45 outside of cavity 46 of support structure 28 with the rotating lock member 45 being disposed in a locked position (solid lines). Conductive contacts 86A-86C are disposed in an end portion 87 of cavity 46 of cross member 28. The contacts 86A-86C are electrically connected to wires/conductive lines/electrical conductors 21A-21C, respectively, of support structure 28 of electrically-powered accessory 15. When rotating lock member 45 is inserted into cavity 46 and rotated to the locked position, the conductive pins 84A-84C are in contact with contacts 86A-86C to provide an electrical connection. When rotating lock member 45 is inserted into cavity 46 and rotated to the locked angular position shown in FIG. 5, projection 74 is in an engaged position designated 74C and the pins 84A-84C of projection 74 are in contact with conductive contacts 86A-86C, respectively, in transverse end portion 87 of cavity 46 (see also FIG. 10).

As noted above, during installation of electrically-powered accessory 15, end 40 of support structure 28 is aligned with opening 42 of rail 6, and rotating lock member 45 is rotated to the unlocked position (FIG. 4). When the rotating lock member 45 is in the unlocked position, the first projection 70 is in the position 70A shown in dashed lines (FIG. 5), and the second projection 74 is in the position 74A also shown in dashed lines in FIG. 5. When the rotating lock member 45 is rotated to this position, the second projection 74 is aligned with a portion 92 of cavity 46 of cross member 29, and the inner end 67 and second projection 74 of rotating lock member 45 can be inserted into cavity 46 as shown by the arrow "C" by shifting the lock assembly 38 towards support structure 28 (see also FIG. 4).

Figure 6:
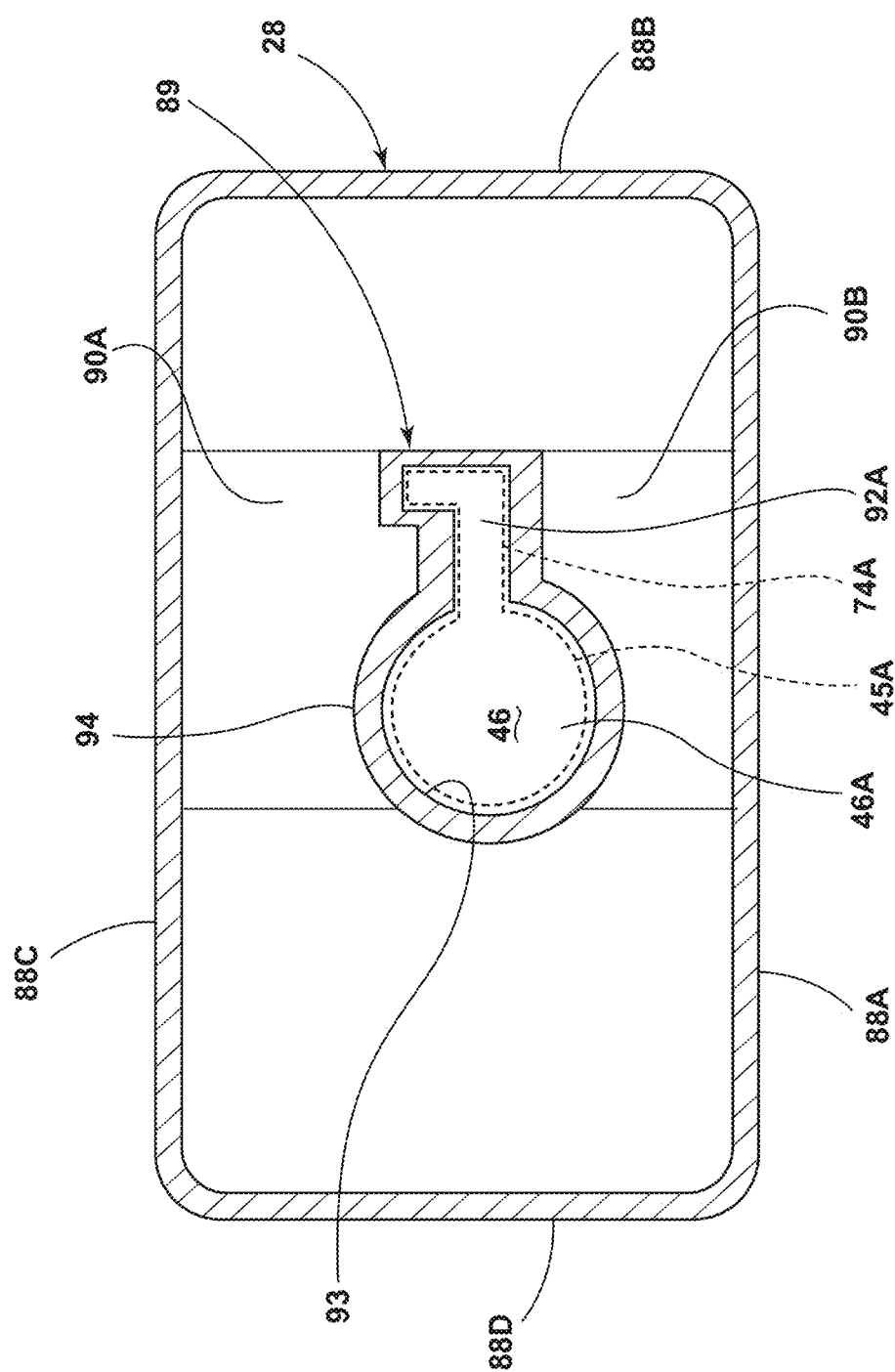
FIG. 6 is a partially schematic cross sectional view taken along the line VI-VI of FIG. 5.

With further reference to FIG. 6, outer end portion 46A of cavity 46 may include a cylindrical surface portion 93 formed by a web 94. The cross member 28 may include sidewalls 88A-88D and internal structures or webs 90A and 90B that support the internal structure 89. The portion 92A of cavity 46A adjacent end 40 of cross member 28 is configured to receive second projection 74 when the rotating lock member 45 is in the unlocked position. It will be understood that FIGS. 5-9 are partially schematic in nature, and sidewalls 88A-88D, web 94, and webs 90A, 90B are merely examples of suitable structures. The present disclosure is not limited to these examples, and virtually any structure may be utilized.

Figure 7:
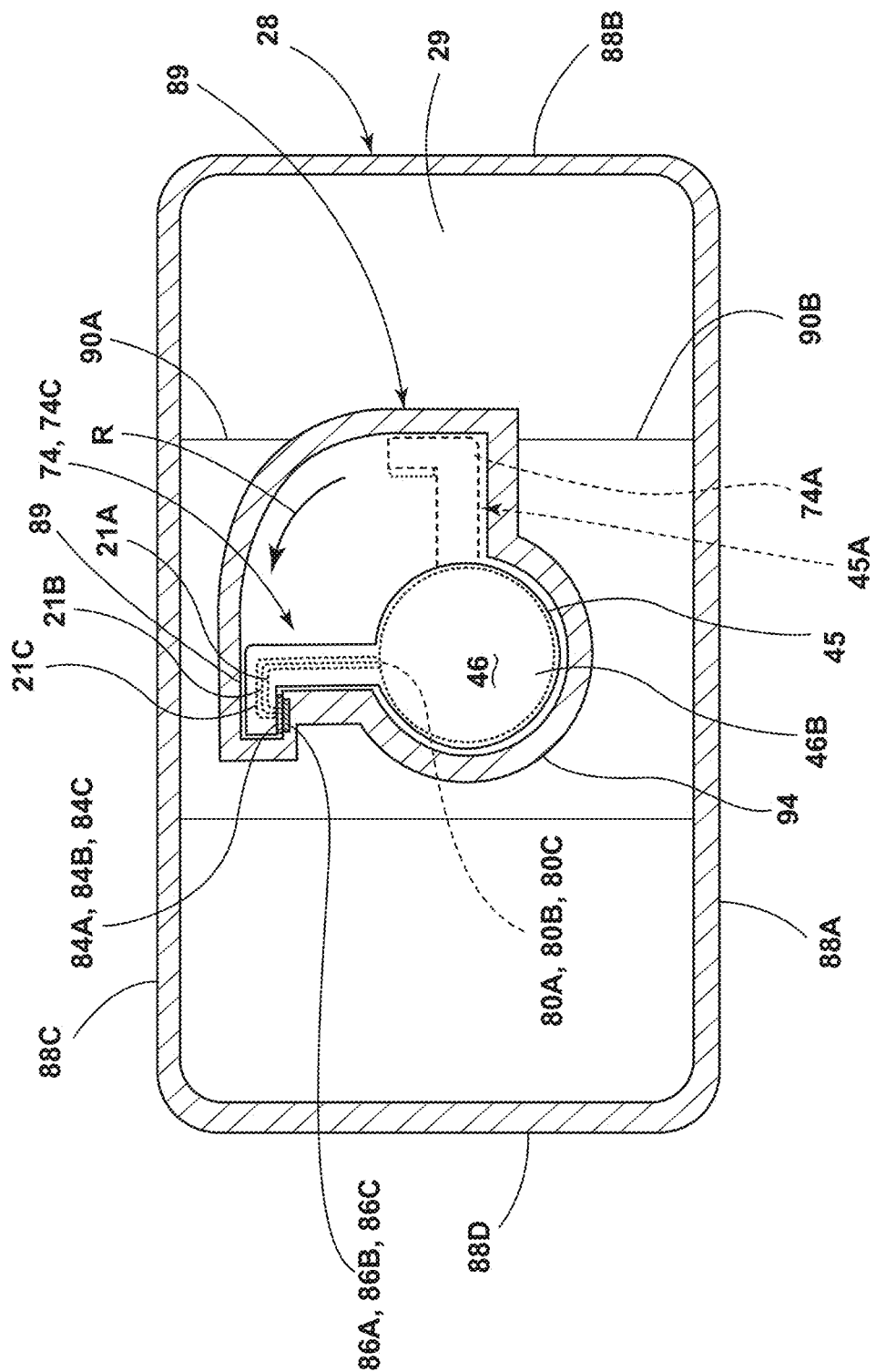
FIG. 7 is a partially schematic cross sectional view taken along the line VII-VII of FIG. 5.
Figure 8:
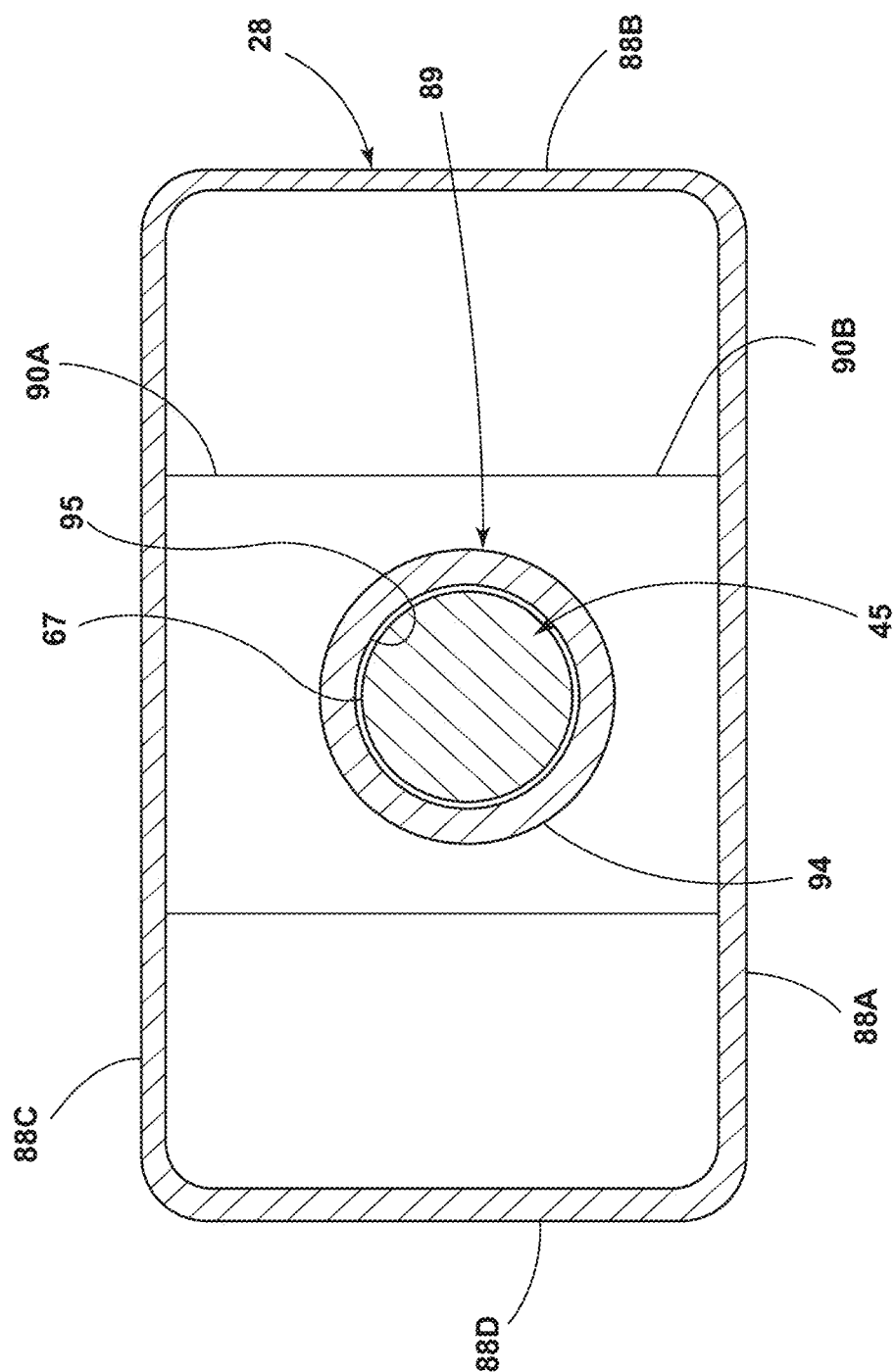
FIG. 8 is a partially schematic cross sectional view taken along the line VIII-VIII of FIG. 5.
Figure 9:
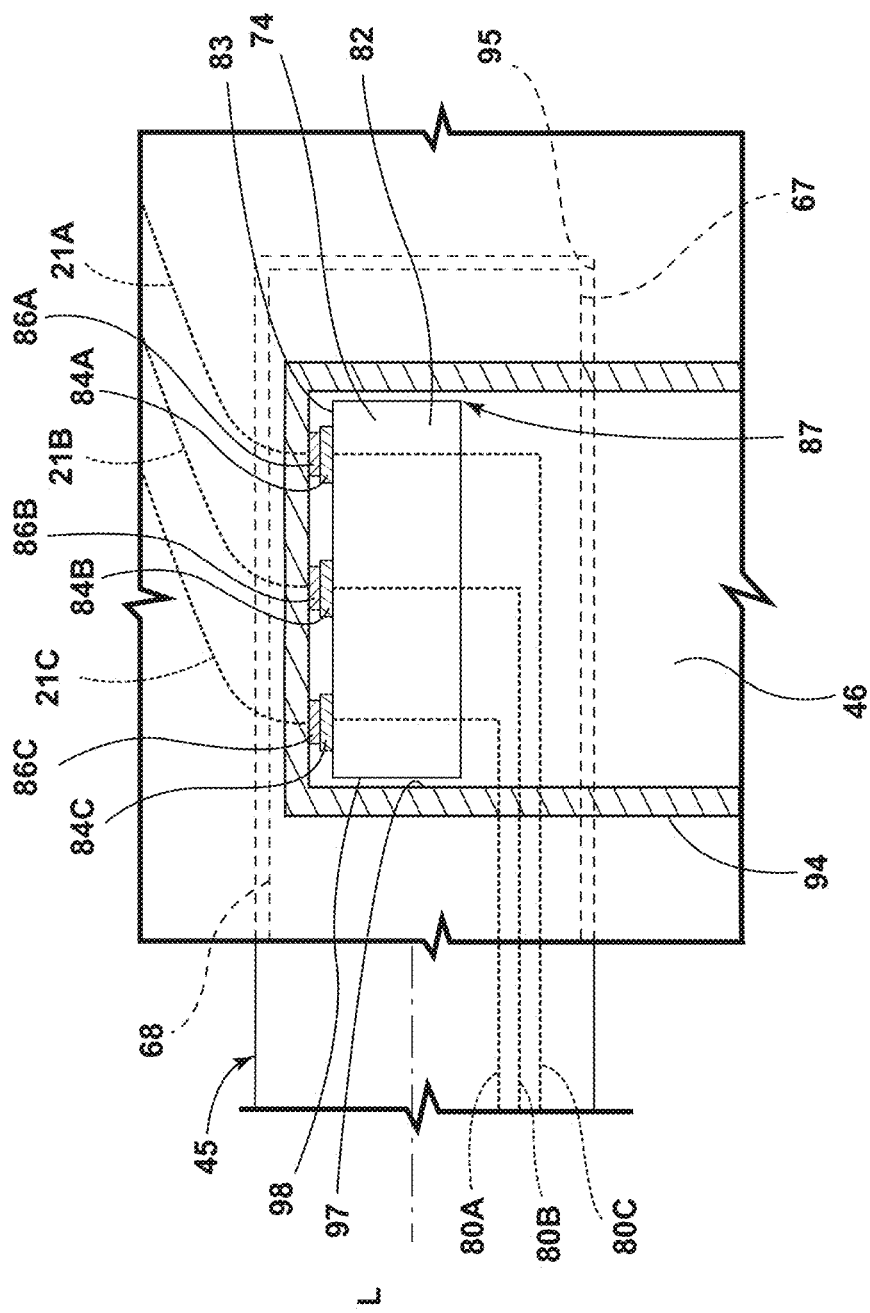
FIG. 9 is a partially schematic cross sectional view taken along the line VIX-VIX of FIG. 5.

With further reference to FIGS. 7 and 8, when the lock member 45 is fully inserted into the cavity 46 of cross member 28, the end portion 67 is disposed in cylindrical portion 95 of cavity 46 (see also FIG. 9). The rotating lock member 45 is then rotated as shown by the arrow "R" (FIG. 7) to the locked position 74 to thereby cause the conductive pins 84A-84C on second projection 74 to engage conductive contacts 86A-86C, respectively, which are disposed on an inner surface 96 of cavity 46 to thereby electrically interconnect electrical conductors 80A-80C of rotating member 45 with electrical conductors 21A-21C, which may be disposed in internal space 29 of cross member 28.

With further reference to FIG. 9, when rotating lock member 45 is rotated to the locked position, side surface 98 of second projection 74 of rotating lock member 45 is disposed directly adjacent lock surface 97 formed by web 94 to prevent removal of rotating lock member 45 from cavity 46. Thus, when the second projection 74 of rotating lock member 45 is in the locked position, the electrically-powered accessory 15 is mechanically and electrically interconnected to the rail 6.

Figure 11:
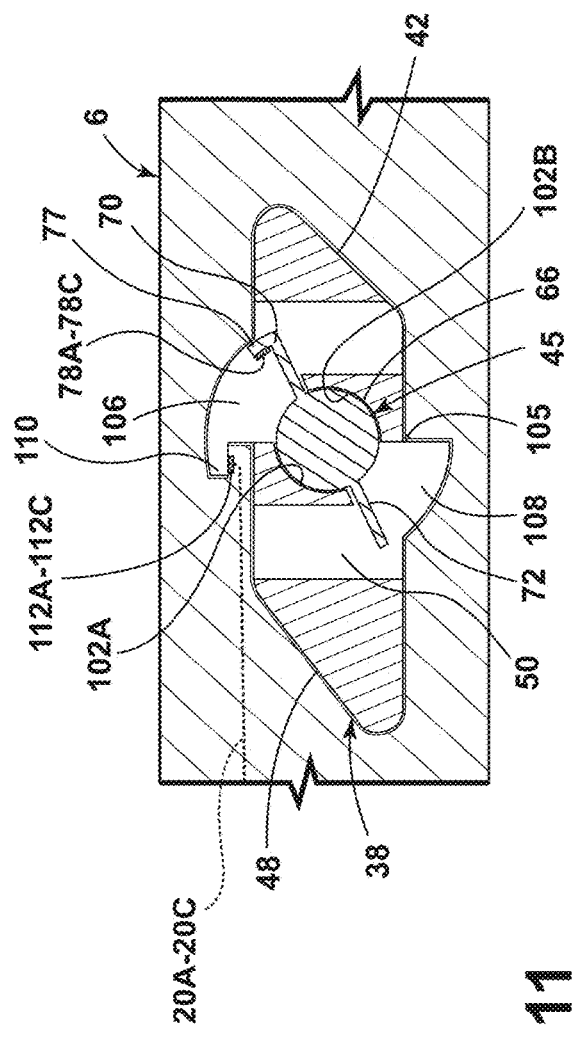
FIG. 11 is a partially schematic cross sectional view of the rail and lock mechanism of FIG. 10 taken along the line XI-XI showing the lock member in an unlocked configuration.
Figure 12:
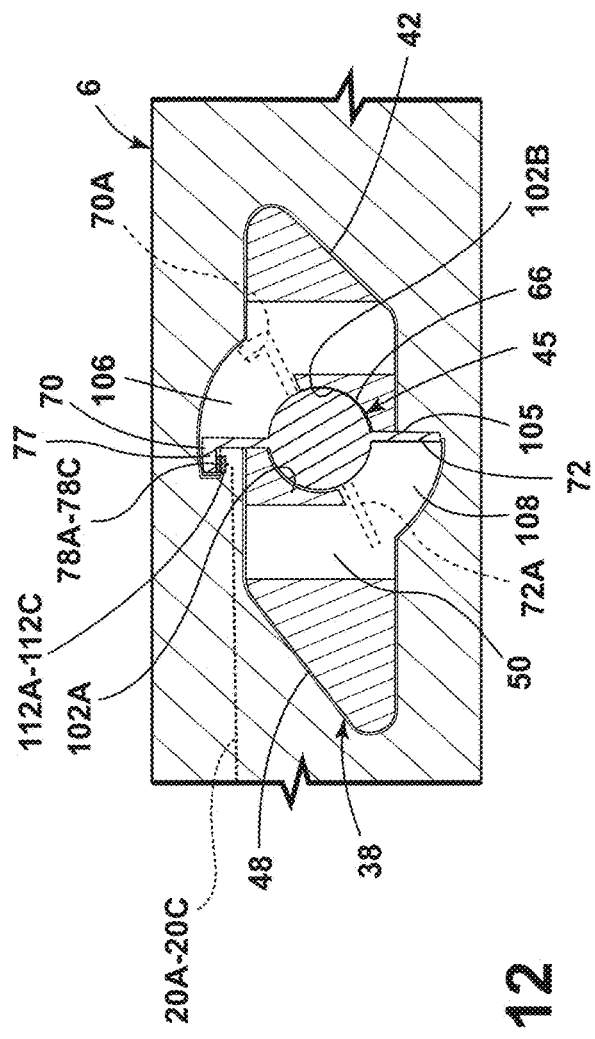
FIG. 12 is a partially schematic cross sectional view of the rail and lock mechanism of FIG. 11 showing the lock member in an locked position.

As discussed above in connection with FIG. 4, rotating lock member 45 is rotatably disposed in cavity 50 of lock body 48 of lock mechanism 38. With further reference to FIGS. 10-13, the central portion 66 of rotating lock member 45 may be rotatably supported by cylindrical bearing surfaces 102A and 102B of lock body 48 for rotation about lock axis "L." Cavity 50 of body 48 includes an upper opening 104 (FIG. 4), whereby first projection 70 of rotating member 45 projects upwardly through opening 104 when rotating lock member 45 is in the locked position (e.g., FIG. 12). The lock body 48 also includes a lower opening 105 (FIGS. 11 and 12). When the rotating lock member 45 is a locked position (FIG. 12), the projection 72 projects downwardly through lower opening 105. As discussed in more detail below, rail 6 includes an upper recess 106 and a lower recess 108 that receive first projection 70 and third projection 72, respectively, to prevent movement of lock member 45 along axis "L" to (FIG. 5) to thereby lock the lock mechanism 38 to rail 6.

When the lock assembly 38 is inserted into opening 42 of rail 6, the upper opening 104 is generally aligned with upper recess 106 of rail 6, and lower opening 105 of lock body 48 is generally aligned with lower opening 105 in rail 6. After the lock assembly 38 is inserted into opening 42 of rail 6, the rotating lock member 45 is rotated from the unlocked position (FIG. 11) to the locked position (FIG. 12). When rotating lock member 45 is in the locked position, the transverse end portion 77 of projection 70 is received in a secondary pocket or recess 110 of upper recess 106, and the pins 78A-78C are in contact with electrical contacts 112A-112C. Electrical contacts 112A-112C are electrically connected to conductors 20A-20C, respectively, and conductors 20A-20C are electrically connected to the vehicle electrical power supply 20 as discussed above in connection with FIGS. 1 and 2. Thus, when rotating lock member 45 is in the locked position, the electrically-powered accessory 15 is electrically connected to the vehicle electrical power supply 20.

Figure 10:
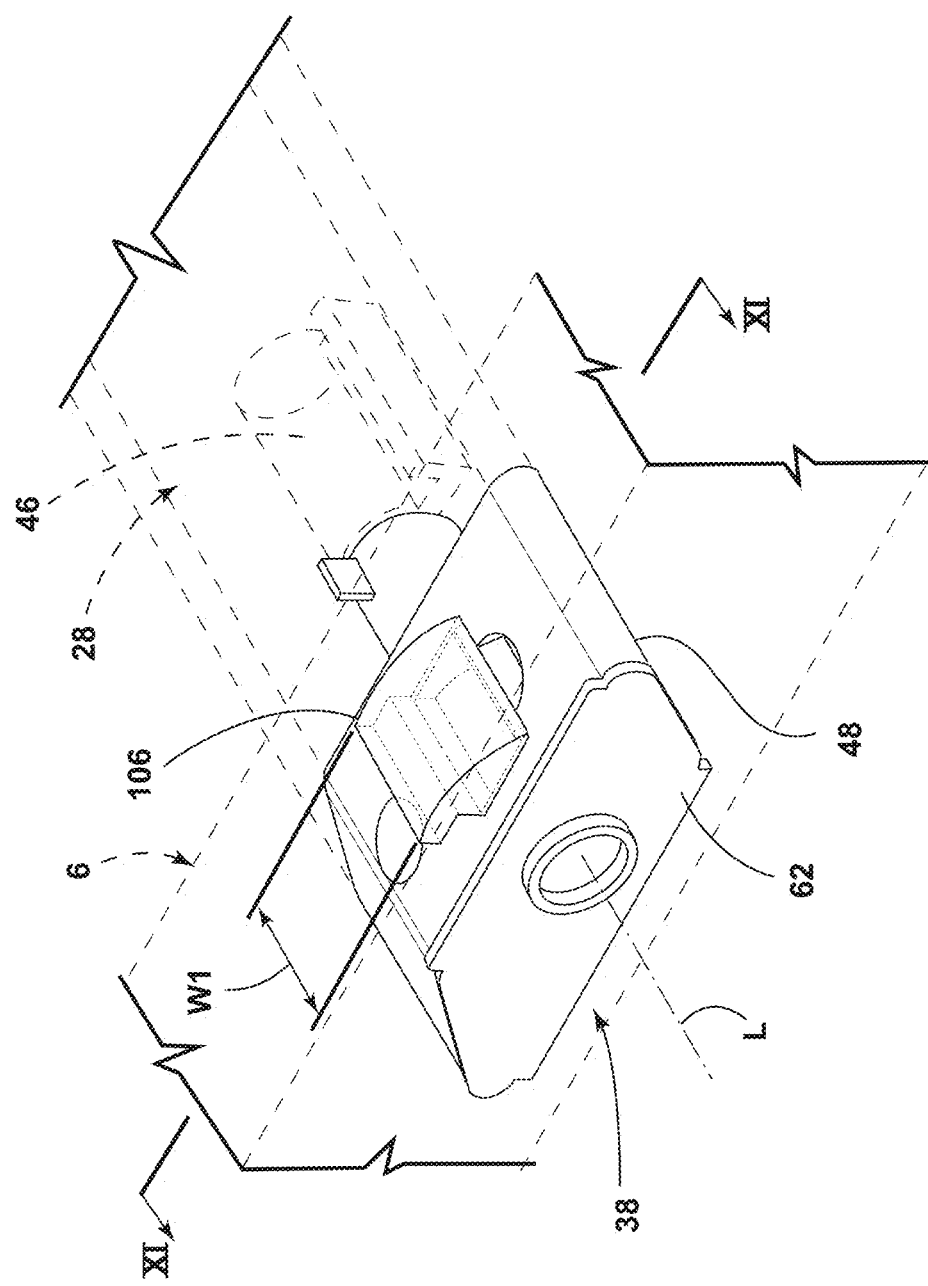
FIG. 10 is a partially schematic view showing the lock mechanism and cavities of a rail.
Figure 13:
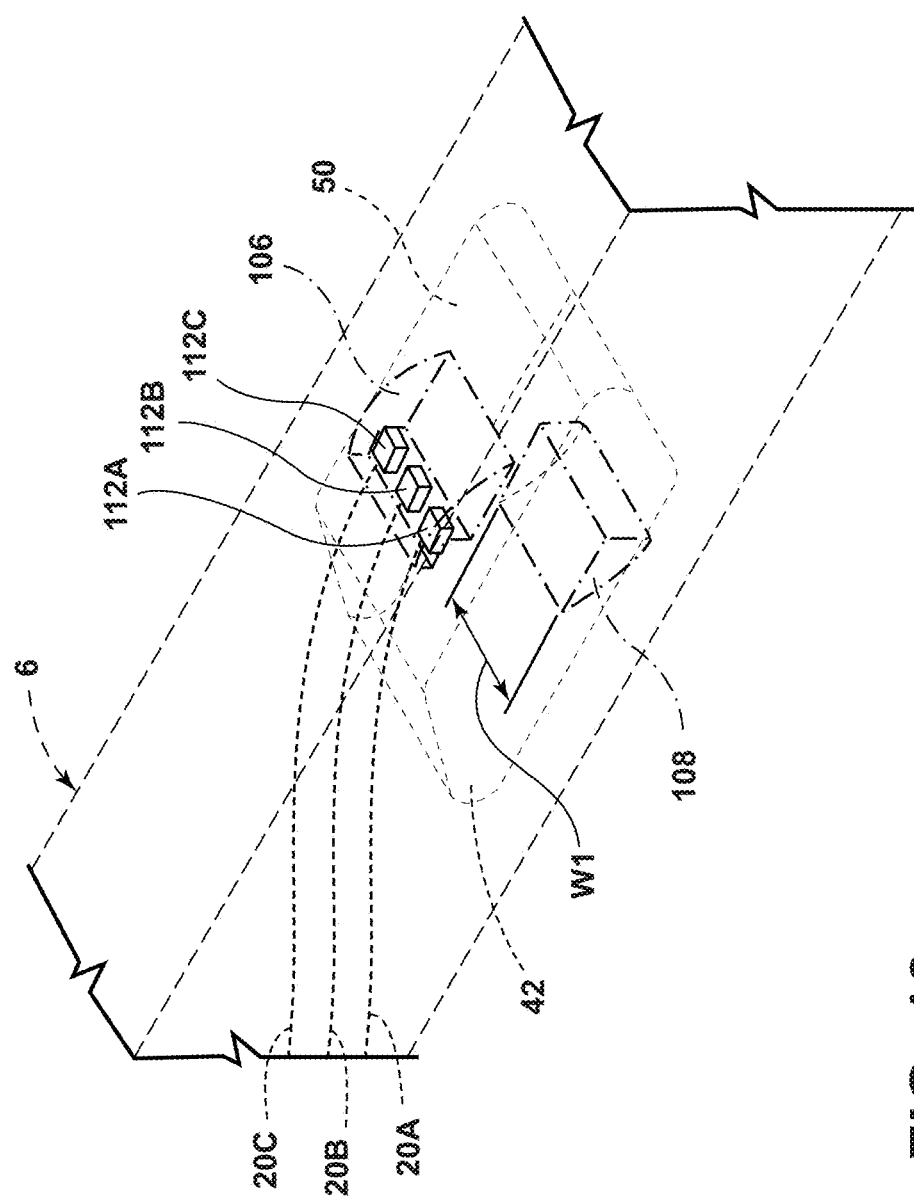
FIG. 13 is a partially schematic isometric view showing cavities and electrical contacts in a rail of the vehicle of FIG. 1.

With reference to FIGS. 10 and 13, the upper recess 106 of rail 6 may have a dimension "W1" that is slightly larger than the dimension "W2" of projection 70 (FIG. 5). Thus, when projection 70 is received in upper recess 106, the rotating lock member 45 cannot shift axially along the axis "L." The lower recess 107 may also have a dimension "W1," and projection 72 may also have a dimension "W2" (FIG. 5), such that the projection 72 also prevents shifting of lock mechanism 38 in the direction of axis "L" when rotating lock member 45 is in the locked position.

Figure 14:
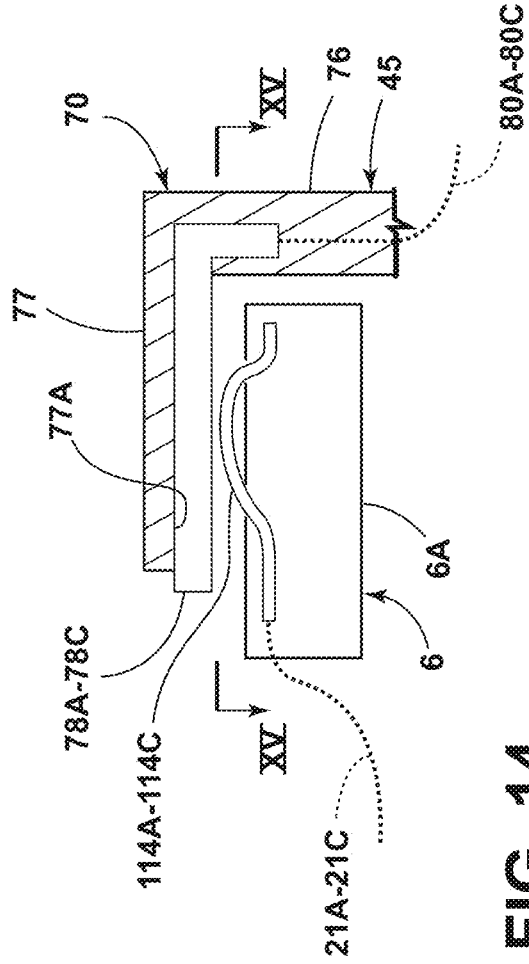
FIG. 14 is a partially schematic cross sectional view showing the electrical contacts of the movable lock member 5 and the vehicle.
Figure 15:
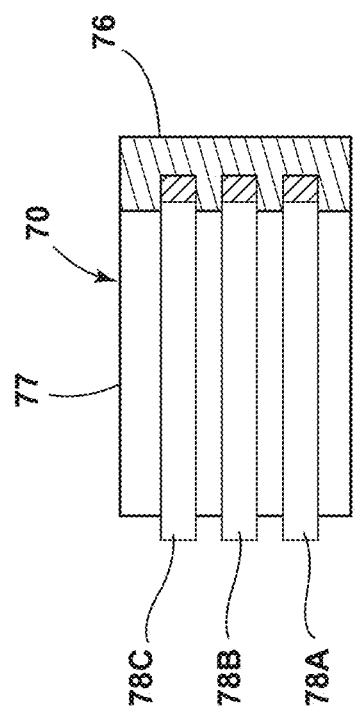
FIG. 15 is a partially schematic cross sectional view of a portion of the lock member taken along the line XV-XV of FIG. 14.

With further reference to FIGS. 14 and 15, the pins 78A-78C may be positioned on a lower side surface 77A of transverse end portion 77 of projection 70 of rotating lock member 45. As discussed above, pins 78A-78C are electrically connected to conductive lines 80A-80C which are disposed on or in rotating lock member 45 (see also FIG. 5). As also discussed above, electrical contacts 112A-112C are electrically connected to conductive lines 21A-21C of electrically-powered accessory 15.

As shown in FIG. 14, the electrical contacts 112 may comprise flexible or resilient spring-like members having curved projecting portions 114A-114C that resiliently contact pins 78A-78C when the rotating lock member 45 is in the locked position to thereby ensure an electrical contact between pins 78A-78C and electrical contacts 112A-112C, respectively.

As discussed above in connection with FIG. 7, projection 74 may include pins 84A-84C that come into electrical contact with conductive contacts 86A-86C, respectively, when rotating lock member 45 is in the locked position. The pins 84A-84C and contacts 86A-86C may have a configuration that is substantially similar to the arrangement shown in FIGS. 14 and 15. However, it will be understood that the configuration of the pins and contacts are not limited to any specific arrangement.

It will be understood that the present disclosure is not limited to an electrically-powered accessory 15 that is configured to be positioned on an upper portion of a vehicle. For example, rack assembly 5A (FIG. 2) may comprise an electrically-powered accessory 15 that is electrically and mechanically connected to a vehicle structure (receiver 11) utilizing lock mechanism 38.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A combination electrically-powered rack accessory and rack for motor vehicles, comprising:
    a first rail and a second rail spaced from the first rail;
    a vehicle electrical conductor adapted to be operably connected to an electrical power supply of a vehicle;
    an electrically-powered rack accessory having an electrical conductor;
    a first connector mechanically connecting the electrically-powered rack accessory to the first rail;
    a second connector mechanically connecting the electrically-powered rack accessory to the second rail;
    wherein the first connector includes a movable lock member that is movable between a locked position and an unlocked position, the movable lock member mechanically locking the electrically-powered rack accessory to the first rail when the movable lock member is in the locked position to prevent detachment of the electrically-powered rack accessory from the first rail when the movable lock member is in the locked position;
    and wherein the movable lock member causes the electrical conductor of the electrically-powered rack accessory to be electrically connected to the vehicle electrical conductor when the movable lock member is in the locked position, and causes the electrical conductor of the electrically-powered rack accessory to be electrically disconnected from the vehicle electrical conductor when the movable lock member is in the unlocked position.

2. The electrically-powered rack accessory of claim 1, wherein:
    the movable lock member includes an electrically conductive vehicle contact and an electrically conductive accessory contact, wherein the electrically conductive vehicle contact is electrically connected to the electrically conductive accessory contact; and
    when the movable lock member is in the locked position, the electrically conductive vehicle contact is electrically connected to the vehicle electrical conductor and the electrically conductive accessory contact is electrically connected to the electrical conductor of the electrically-powered rack accessory.

3. The electrically-powered rack accessory of claim 2, wherein:
    the first connector includes a body; and
    the movable lock member is pivotably interconnected with the body and pivots between the locked position and the unlocked position.

4. The electrically-powered rack accessory of claim 3, wherein:
    the movable lock member includes a central portion and a first projection extending outwardly from the central portion, and a second projection extending outwardly from the central portion;
    wherein the electrically conductive vehicle contact is located on the first projection, and wherein the electrically conductive accessory contact is located on the second projection.

5. The electrically-powered rack accessory of claim 4, wherein:
    the electrically conductive vehicle contact comprises a pin disposed on the first projection; and
    the vehicle electrical conductor comprises a resilient conductor mounted to the first rail.

6. The electrically-powered rack accessory of claim 5, wherein:
    the central portion of the movable lock member defines a pivot axis about which the movable lock member pivots;
    the first projection includes a radial first portion that extends radially outward away from the pivot axis; and a transverse end portion that is transverse to the radial first portion; and
    the pin is disposed on the transverse end portion of the first projection.

7. The electrically-powered rack accessory of claim 4, wherein:
    the first rail includes a connector opening; and
    the body of the first connector is at least partially disposed in the connector opening.

8. The electrically-powered rack accessory of claim 7, wherein:
    the first rail includes an inner side and an outer side and the connector opening extends between the inner side and the outer side, the first rail further including a lock surface disposed between the inner and outer sides of the first rail; and
    the first projection engages the lock surface when the movable lock member is in the locked position to prevent removal of the body of the first connector from the connector opening of the first rail.

9. The electrically-powered rack accessory of claim 8, wherein:
    the electrically-powered rack accessory includes a cavity;
    the electrically conductive accessory contact is disposed in the cavity; and
    the second projection is received in the cavity of the electrically-powered rack accessory and the electrically conductive accessory contact on the second projection engages the electrical conductor of the electrically-powered rack accessory when the movable lock member is in the locked position.

10. The electrically-powered rack accessory of claim 9, wherein:
  the movable lock member has an inner end and an outer end, the first projection is located adjacent the outer end, and the second projection is located adjacent the inner end;
  the cavity of the electrically-powered rack accessory includes a first portion that is configured to receive the inner end of the movable lock member, an accessory lock surface extending transverse relative to the first portion; and
  the second projection engages the accessory lock surface when the movable lock member is in the locked position to thereby prevent removal of the movable lock member from the cavity of the electrically-powered rack accessory.

11. The electrically-powered rack accessory of claim 10, including:
  a user interface operably connected to the vehicle electrical conductor; and wherein:
  the user interface is configured to permit a user to control the electrically-powered rack accessory from a passenger space of a motor vehicle.

12. An electrically-powered exterior accessory for motor vehicles, comprising:
  a support structure configured to be removably mounted to a vehicle exterior structure;
  a lock mechanism including a movable lock member configured to engage the support structure and the vehicle exterior structure when the movable lock member is in a locked position to thereby prevent removal of the structure from the vehicle exterior structure when the movable lock member is in the locked position, and wherein the movable lock member is movable from the locked position to an unlocked position, and wherein the structure can be removed from the vehicle exterior structure when the movable lock member is in the unlocked position, the movable lock member further including vehicle contacts that are electrically connected to accessory contacts whereby, when the movable lock member is in the locked position, the vehicle contacts are configured to engage conductors of a vehicle electrical system, and the accessory contacts engage conductors of the electrically-powered exterior accessory, and wherein, when the movable lock member is in the unlocked position the accessory contacts are disengaged from the conductors of the electrically-powered exterior accessory and/or the vehicle contacts are configured to be disengaged from the conductors of the vehicle electrical system.

13. The electrically-powered exterior accessory for motor vehicles of claim 12, wherein:
  the lock mechanism includes a body and the movable lock member is rotatably mounted to the body, the movable lock member including a central portion about which the movable lock member rotates and first and second projections extending outwardly away from the central portion;
  wherein the vehicle contacts are disposed on the first projection; and
  the accessory contacts are disposed on the second projection.

14. The electrically-powered exterior accessory for motor vehicles of claim 13, wherein:
  the support structure includes a lock surface; and
  the second projection engages the lock surface when the movable lock member is in the locked position.

15. The electrically-powered exterior accessory for motor vehicles of claim 14, wherein:
  the body of the movable lock member comprises a first bearing surface;
  the central portion of the movable lock member includes a second bearing surface; and
  the first bearing surface engages the second bearing surface wherein the movable lock member is rotatably supported by the body.

16. A method of mechanically and electrically connecting an electrically-powered accessory to a motor vehicle, the method comprising:
  moving a lock member from a disengaged position to an engaged position, wherein moving the lock member from the disengaged position to the engaged position causes the electrically-powered accessory to be mechanically secured to the motor vehicle and also causes the electrically-powered accessory to be electrically connected to an electrical power system of the motor vehicle; and wherein:
  the lock member includes accessory contacts that are electrically connected to vehicle contacts; and
  moving the lock member from the disengaged position to the engaged position includes: 1) Causing the accessory contacts to contact electrical conductors of the electrically-powered accessory; and 2) causing the vehicle contacts to contact the electrical conductors of the electrically-powered accessory whereby the electrically-powered accessory is powered by the vehicle electrical power system when the lock member is in the engaged position.

17. The method of claim 16, wherein:
the lock member is rotatably interconnected to a body; and
moving the lock member from the disengaged position to an engaged position includes rotating the lock member relative to the body.

18. The method of claim 17, including:
causing a support structure of the electrically-powered accessory to engage a vehicle exterior structure prior to moving the lock member from the disengaged position to the engaged position.

19. The method of claim 16, wherein:
the vehicle contacts are disposed on a first projection of the lock member;
the accessory contacts are disposed on a second projection for the lock member; and
moving the lock member from the disengaged position to the engaged position includes rotating the lock member to cause the first projection to engage a lock surface of the vehicle exterior structure and cause the second projection to engage a lock surface of the electrically-powered accessory.

* * * * *